(12) United States Patent
Lovell

(10) Patent No.: US 6,580,378 B1
(45) Date of Patent: Jun. 17, 2003

(54) METHOD AND APPARATUS FOR DIGITAL DATA ENUMERATION

(75) Inventor: William S. Lovell, Aloha, OR (US)

(73) Assignee: Wend, LLC, Lincoln City, OR (US)

( * ) Notice: Subject to any disclaimer, the term of this patent is extended or adjusted under 35 U.S.C. 154(b) by 109 days.

(21) Appl. No.: 09/690,859

(22) Filed: Oct. 18, 2000

Related U.S. Application Data

(62) Division of application No. 09/323,153, filed on Jun. 1, 1999.

(51) Int. Cl.[7] ............................................. H03M 9/00
(52) U.S. Cl. ...................................... 341/100; 341/101
(58) Field of Search ............................ 341/100, 101, 341/50, 55

(56) References Cited

U.S. PATENT DOCUMENTS 4,813,056 A  *  3/1989  Fedele ...................... 341/107
4,885,584 A  * 12/1989  Dalrymple ................. 341/101

* cited by examiner

*Primary Examiner*—Don Le
(74) *Attorney, Agent, or Firm*—William S. Lovell

(57) ABSTRACT

A digital concatenator, the operation of which is triggered by the sequential arrival of a series of n-bit bytes thereto, accepts such sequential n-bit bytes and, by directing those n-bit bytes into sequentially identified n-bit channels, concatenates those n-bit bytes into (n×m)-sized words, where m is a pre-selected integral number of said n-bit bytes that are desired to be concatenated with an (n×m)-sized output buffer into a resultant sequence of (n×m)-sized words. The sequential identification of those n-bit bytes is brought about by a cyclical counter incorporated within a data enumerator that counts off the arrival of each n-bit byte and appends a corresponding position bit or byte to each one thereof. Each successive reading of the output of the concatenator is triggered by the arrival at that output buffer through an $m^{th}$ channel of an $m^{th}$ n-bit byte. The concatenator similarly operates on single bits so as to serve as a serial to parallel converter of arbitrarily selectable size.

10 Claims, 2 Drawing Sheets

METHOD AND APPARATUS FOR DIGITAL DATA ENUMERATION

This is a division of application Ser. No. 09/323,153, filed Jun. 1, 1999.

BACKGROUND OF THE INVENTION

1. Field of the Invention

This invention relates to methods and hardware apparatus for the counting and concatenation of one- or more-bit digital data segments into larger words for more efficient transmission and CPU utilization and related purposes.

2. Background of the Invention

Computer operations in general rest upon the premise that particular collections of data bits, when produced within a program or when entered by an operator, will bring about some desired result, as when a word corresponding to a word in some command set is produced within a program to cause a particular operation to take place, or when ASCII code is used to enter alphanumeric data into a program, likewise either to bring about some desired operation or simply for storage of such data, or indeed in the transmission of voice, imagery or video communications and the like. What may be termed the "sense" of the word as a command mnemonic or some other meaning then requires some kind of byte-by-byte "interpretive" process to be carried out by the CPU.

One disadvantage of such a byte-by-byte procedure is that it may utilize clock cycles within the CPU unnecessarily. A purpose in avoiding use of the CPU is that if one can accomplish a task using some fraction of the number of clock cycles that would otherwise be required, then the throughput of the CPU, with respect to that particular task, will be multiplied in a corresponding ratio. Similarly, if a communications pathway or bus is constructed so as to accommodate, say, 16-bit, 32-bit or larger words, but in each clock cycle is being used instead to convey 8-bit bytes, for those operations the CPU is correspondingly being underutilized by a factor of 2 or 4 or more, as the case may be.

Also, because of the well-known von Neumann bottleneck, operations requiring use of a CPU are likely to be carried out much slower than they might be otherwise, e.g., as in a gate array. In lieu of various concatenation and interpretive procedures that employ a CPU, it has thus seemed useful to provide a method and apparatus for carrying out such operations by hardware means that are separate from any CPU. The purposes in so doing include not only minimization of CPU usage, but also introduction of greater data transmission efficiencies and the avoidance of software errors, e.g., either fixed "bugs" or soft errors. The principle of the invention rests on the premise that greater efficiency in computer operations can be achieved by processes by which the data to be treated are "conditioned" prior to entry into the computer, by which is meant that they are so treated as to maximize both the efficiency of their transmission into the computer and the efficiency of their processing within the computer.

Such operations as concatenation, sorting, and other data manipulation have of course become routine as part of computer operations, and numerous programs have been written therefor but, no doubt because of the astounding success of such computer operations, there seems to have been developed very little in the way of asynchronous circuitry that would perform the same or similar tasks, and perhaps precisely because of the success of related computer-controlled operations. One kind of operation that would seem to lend itself to such treatment is that of serial-to-parallel (S/P) conversion, which is done conventionally by means of clock-operated shift registers that accumulate a sequence of n serial bits that are then read in parallel so as to effect the desired conversion.

One effort to avoid CPU use in the context of serial-to-parallel conversion is seen in U.S. Pat. No. 5,862,367 issued Jan. 19, 1999 to Chiao-Yen. This device acts in response to a chip select signal by separating certain pre-determined identifying information (that will specify a particular receiving register) from associated data portions of the received serial data and then transmitting the data portion when rendered parallel to the selected receiving register. S/P conversion is accomplished by an array of D-type flip-flops having common reset signals RS and clock signals CK so as to function as a shift register in the usual manner. The incoming data are thus both rendered parallel and placed into particular receiving registers, i.e., the data are sorted in accordance with pre-determined criteria so as to yield a collection of parallel words residing in pre-determined registers or memory locations.

Another, more complex S/P circuit is found in U.S. Pat. No. 4,079,373 issued Mar. 14, 1978 to Koenig. This device is specifically adapted to treat incoming data that, similar to those of the Chiao-Yen device, are separated into discrete data formats and control formats. Varying numbers of control bit sets are presumed to arrive at irregular times, and the last of such bit sets in a particular sequence signals that the set of data next to follow comprises data bits that are to be converted from serial to parallel form, for which conventional shift register means operated by a clock signal are used to accomplish the S/P conversion.

Both of the foregoing devices are limited in general applicability in that they assume a particular formatting or structure to be present in the incoming serial data, and require a clock signal since they use conventional flip-flop or TTL shift registers. The effect of using a clock signal is of course to fix the rate of S/P conversion, without regard to variations in the rate at which data may be received. In the case of data that are received by a modem or the like, such data reception rates may vary considerably in practice, depending upon such factors as the load currently being imposed on the originating data source and the intervening transmission means, hence it seemed useful to be able to adjust the rate of S/P (or any other kind of conversion) to the actual data reception rate, e.g., to permit the device to function asynchronously. The concomitant speed advantage of asynchronous logic circuits might then be "wedded" to various other advantages provided by computers, while at the same time avoiding use of the CPU, and thereby to enhance the operation of those computers themselves.

SUMMARY OF THE INVENTION

The invention accomplishes those purposes both as to S/P conversion and to what may be termed a "larger word equivalent" thereof, i.e., the concatenation of data sequences larger in number that the single bits treated in S/P conversion. Data paths to the CPU, whether from a modem or the like or from sources internal to the computer, can then be more fully exploited. The invention comprises both a data enumerator wherein a "sequence number" or "position number" is appended to each data segment as it is received, and a digital concatenator that then accepts such a series either of signals bits or bytes, as for example 8-bit ASCII characters, and concatenates those bits into bytes or words of selected length (i.e., standard S/P conversion), or concatenates such bytes into 16-, 24-, 32-bit or larger words while retaining the sequencing of those bytes within a larger word path or register. Separate instances of the concatenator can also be cascaded in pre-selected combinations to achieve any desired data format. If the incoming data sequences have a known structure, the computer can be programmed to handle them more efficiently in that such longer length words can be immediately disassembled to send the separate parts thereof into registers having known addresses for specific pre-determined purposes.

DETAILED DESCRIPTION OF THE INVENTION

Figure 1:
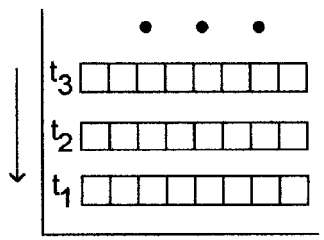
FIG. 1 represents a sequence of 8-bit bytes arriving at a node at a series of times $t_1$, $t_2$, $t_3$, etc.

FIG. 1 shows a sequence of bytes, shown as 8-bit bytes for purposes of illustration, presumed to be received at some node N at the successive times $t_1$, $t_2$, $t_3$, etc., wherein the ellipsis is meant to represent a continuing sequence of such bytes. The invention relates to the formation of such a byte sequence into multiple-byte words, as well as the special case of forming sequences of bits into multiple-bit bytes (i.e., S/P conversion), in an apparatus so constructed. The term "concatenation" is used herein to describe any such process.

Figure 2:
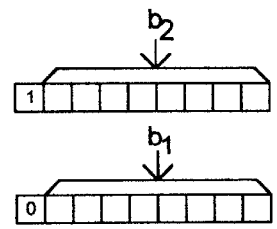
FIG. 2 represents the labeling of specific bytes with position bits.

A first step in the concatenation process is shown in FIG. 2, wherein a first byte $b_1$ has had appended at the start thereof the position bit (PB) "0," and the second byte $b_2$ has had appended at the start thereof the PB "1." It is these PB that identify each particular byte so that it may be transmitted to a desired register, and it must be stressed that these PB are not initially associated with particular bytes, but are instead generated as a consequence of the sequence in which the bytes are received. One means by which such PB may be appended is shown in FIG. 3.

Figure 3:
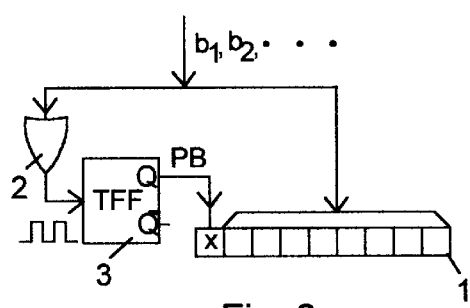
FIG. 3 shows the use of a toggle flip-flop to add a position bit at the leading edge of a data byte and yield the result shown in FIG. 2.

Specifically, a first step in adding a position bit ($PB_i$) to a byte $b_i$ lies in transmitting byte $b_i$ into both a buffer 1 and an OR gate 2 as shown in FIG. 3. Of course, $b_i$ must contain at least one non-zero bit, so that OR gate 2 will yield an output pulse that is transmitted therefrom to the input of a toggle flip-flop (TFF) 3. That pulse serves to "trigger" the resultant operations, and serves in lieu of a clock signal as could be used instead in an analogous synchronous system. The pulsed output of OR gate 2 in the case that sequences of words $W_i$ are to be formed by just two bytes each, during any time sequence in which successive bytes $b_1$, $b_2$, etc., pass into OR gate 3, will thus yield at the "Q" output of TFF 3 correspondingly successive bits "0-1-0-1 . . . " or alternatively successive bits "1-0-1-0 . . . ," depending upon the initial value that is taken to pre-exist at the output of TFF 3. (For example, the gate or collector of a "normally off" transistor would have the high level "1" bit thereon, while the gate or collector of a "normally on" transistor would have the low value "0" bit thereon, but in either case the output from TFF 3 is such that each bit after the first one will have an opposite value from the preceding bit.) It is thus the function of TFF 3 to provide alternating outputs commencing with the first arrival of a byte to OR gate 2. Those successive bits constitute the position bits (PBs) and are shown in the left-most position of buffer 1 of FIG. 3 as having the value "x" in general. Operation of the apparatus of FIG. 3 on successive bytes $b_1$ and $b_2$ thus yields the same bytes $b_1$ and $b_2$ but with appended PB values (i.e., 9-bit bytes) as were shown in FIG. 2.

Figure 4:
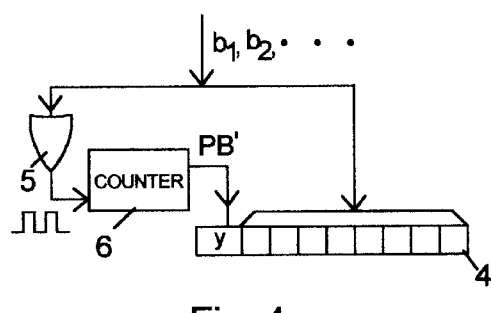
FIG. 4 shows a data enumerator including a counter circuit for adding a position byte at the leading edge of a data byte.

FIG. 4 shows a more general circuit, designated as a "data enumerator," and again using 8-bit bytes as an example wherein the designation "$b_1$" again refers to a byte that arrives at node N at time $t_1$, "$b_2$" refers to a byte that arrives at node N at time $t_2$, and so on. Specifically, FIG. 4 shows a sequence of bytes $b_1$, $b_2$, etc., that are connected both to an n-bit (in this example n=8) right-most portion of a buffer 4 and an OR gate 5, such that successive inputs of bytes having at least one "1" bit therein will yield a corresponding succession of "1" outputs, i.e., the OR gate 5 output effectively acts to "announce" the arrival of each byte. OR gate output 5 should have a fairly rapid RC time constant and rapid decay, and/or similarly the following circuit should have a high response threshold, so as to convert each newly formed "1" level effectively into a trigger pulse. By such means, the device is enabled to act asynchronously, i.e., OR gate 5 provides a "trigger pulse" in the manner of a clock trigger in a synchronous operation as was previously described with respect to FIG. 3.

However, the output of OR gate 5 is connected to a cyclical counter 6 that in this example is shown below as counting through four values, so that in concatenating four 8 bit-bytes into a word, counter 6 would yield a two-bit "position byte" (PB') having successive values "00-01-10-11." Counter 6 is preferably a synchronous counter, in this case meaning not that it is operated from an external clock but rather, as is well known in the art, that the input thereto goes to a series of flip-flops therein simultaneously rather than sequentially as would be the case in a ripple counter, thereby to keep position bytes PB' "in time" with the incoming pulses from OR gate 5. Those values are represented generally in FIG. 4 as "y" in the left-most positions of buffer 4, and as in FIG. 3 that PB' is appended to the corresponding byte (now in FIG. 4 on a two-conductor line). It is apparent that 3-, 4-bit or larger position bytes (PBs) could similarly be generated by counter 6 and employed to concatenate yet larger words out of 8-bit bytes, or on the other hand smaller bytes of two or three bits, etc., or even single bits, could constitute the input instead of 8-bit bytes, and the desired word size could likewise be selected. As is also well known in the art, counter 6 need not be made to count to some power of 2, e.g., 4, 8, 16, etc., but can provide a very wide range of choices for subsequent formatting purposes, i.e., it could be constructed (using "wider" PB' lines) so as to yield a word size of any arbitrary number of bytes, e.g., 7, 9, 15, etc. An alternative manner of describing the operation of the data enumerator of FIG. 4 may be to refer to it as simply a "numbering" process, i.e., the circuit adds to each byte a number that expresses the order in which the successive bytes were received. The numbers so added are referred to above as "position bytes" because, as will now be described, their values determines the sequential locations of each particular byte within the larger word that is being constructed.

Figure 5:
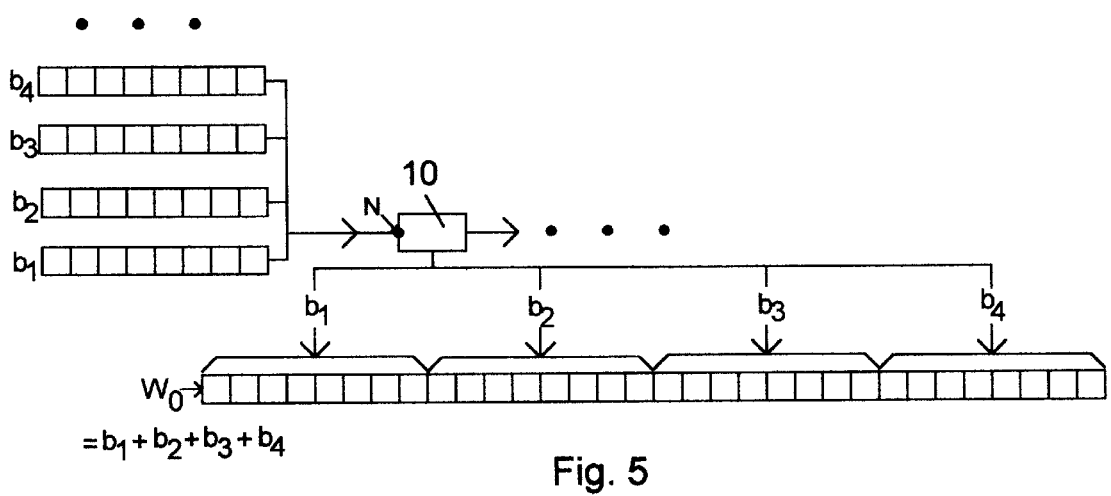
FIG. 5 shows a representative concatenator for concatenating four 8-bit bytes $b_1, \ldots, b_4$ into a 32-bit word W.

For illustration, the manner in which the routing of successive bits or bytes would be carried out to yield composite bytes or words of any selected size is shown in FIG. 5 in terms of the generation of four-byte words from 8-bit bytes, but the principles of operation so described are easily transferable to the generation by such concatenation of either smaller or larger words than those in these examples. Transmission of bytes "$b_1$", "$b_2$",..., "$b_i$" to input node N of a concatenator 10, to be described below, is intended to cause the creation of a word $W_0=b_1+b_2+b_3+b_4$, wherein $b_1, \ldots, b_4$ are concatenated in the relative dispositions shown in the lower portion of FIG. 5. The ellipses shown are intended to indicate a continuing sequence of input bytes (following after $b_4$) and a correspondingly continuing sequence of output words $W_1$, $W_2$, etc., which are additional words after word $W_0$. The same operation may of course be carried out bit-by-bit, in which case concatenator 10 would act as an S/P converter, hence all discussion relative to bytes may be taken to include reference as well to the serial bit-to-parallel byte conversion process.

Figure 6:
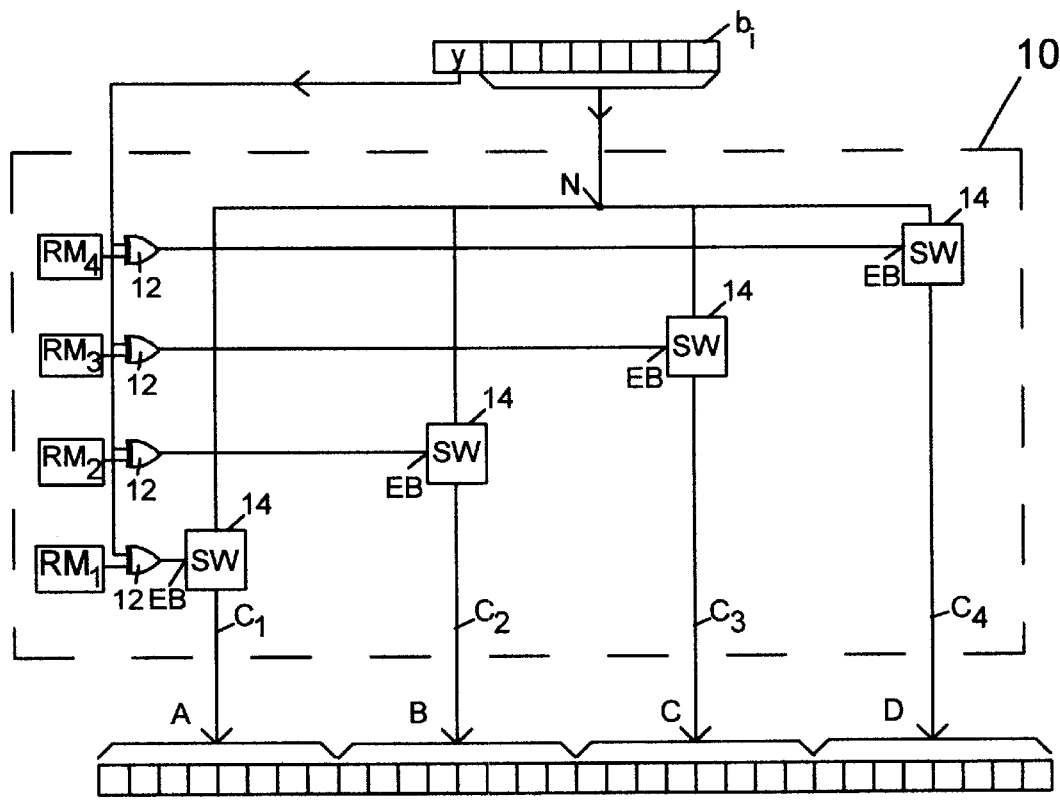
FIG. 6 shows apparatus for accepting a series of data bytes that have been labeled with position bits or bytes and concatenating the same into single data words.

The manner in which the routing of two or more bytes into a single word is accomplished is shown in FIG. 6, wherein it is assumed that successive 8-bit bytes $b_i$ together with position bytes $PB_i$ respectively appended thereto (i.e., after having passed through a circuit such as that of FIG. 4) are transmitted into concatenator 10 in sequence, and thence outwardly from concatenator 10 in parallel (with appended $PG_i$ bytes removed) to an array of byte channels $c_j$, wherein j=1, 2, 3, 4, etc., and the maximum value of j corresponds to the total number of such channels, which in the example of FIG. 6 is just four. The array of four mutually adjacent 8-bit bytes $b_i$ will of course constitute a 32-bit word $W_0$. The "y" lines on which are to appear each $PB_i$ associated with each byte $b_i$ as described with reference to FIG. 4 are also connected as one input to respective XNOR gates 12, a second input thereto being provided by a particular reference byte $RB_i$ held respectively within corresponding reference memories $RM_i$. In brief, a byte $b_i$ will pass through that one byte channel $c_j$ for which $PB_i=RB_j$.

More specifically, FIG. 6 shows eight-bit bytes $b_i$ by way of illustration, and which have (in this case) a two-bit $PB_i$ designated generally as "y" appended thereto. Bits $b_i$ with appended $PB_i$ are assumed to be sequentially imposed onto node N of FIG. 6 from the circuitry of FIG. 4. The respective reference bytes $RB_j$, wherein j=1, 2, 3, 4 in the example of FIG. 6, have the values shown in Table 1:

TABLE I

| j | $RB_j$ |
|---|---|
| 1 | 00 |
| 2 | 01 |
| 3 | 10 |
| 4 | 11 |

A byte $b_i$ will thus have associated therewith a position byte $PB_i$ that will correspond to one and only one of reference bytes $RB_j$. The output of each XNOR gate 12 connects to a particular switch SW 14, and each byte channel $c_j$ connects as input and output of a specific one of switches SW 14. XNOR gates 12 thus serve to determine which channel $c_j$ each particular byte $b_i$ shall pass entirely through, i.e., by way of transmittal through the particular switch SW 14 within that channel $c_j$.

For example, if $PB_3=10$ then since $RB_3=10$, imposition of $PB_3=10$ onto all of the $RB_j$ shown in FIG. 6 will bring about a "1" output only from that XNOR 12 that connects to $RB_3$, and since that particular XNOR 12 is connected to switch (SW) 14 in the third channel, i.e., $c_3$, that "1" bit constitutes an enable bit (EB) that permits transmission of data through that channel $c_j$ with which that SW 14 is connected, i.e., in this case $c_3$ or the C channel. As counter 6 of FIG. 4 proceeds in its sequence 1, 2, 3, 4, counter 6 of course being a cyclical counter having a maximum value corresponding to the number of bytes (in this case, 4) that one wishes to concatenate into a single word, successive bytes $b_1$, $b_2$, $b_3$, $b_4$, $b_5$, $b_6$, etc., will be routed into channels $c_1$, $c_2$, $c_3$, $c_4$, $c_1$, $c_2$, etc., thus to generate from a sequence of n 8-bit bytes a corresponding sequence of n/4 32-bit words.

Figure 7:
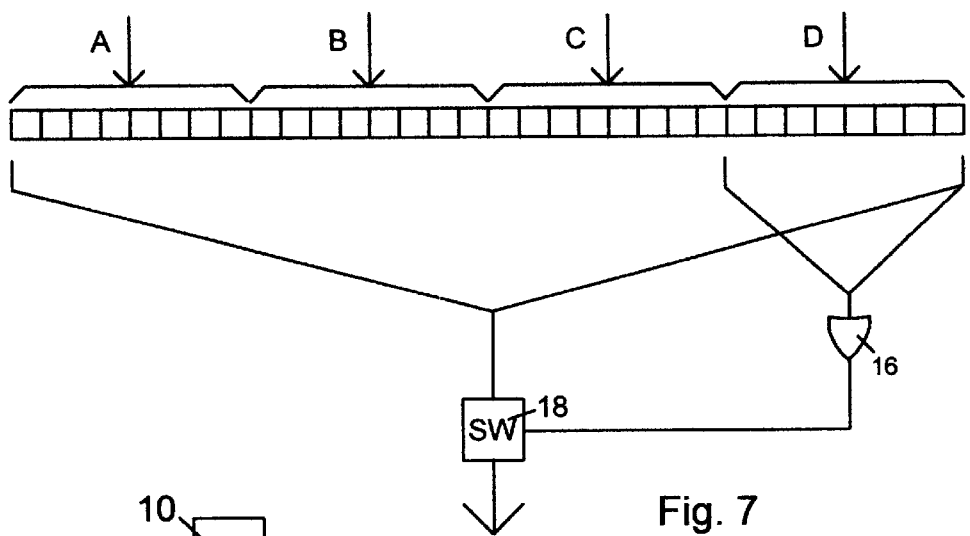
FIG. 7 shows the use of an OR gate to signal when the apparatus of FIG. 6 has completed concatenation of a word so that the resultant word can be read.

If necessary in particular applications, it may be useful to utilize concatenator 10 in conjunction with an OR gate to signal the arrival of the fourth 8-bit byte $b_4$ whereby the desired 32-bit word $W_0$ will have been completely formed. As shown in FIG. 7, such an OR gate 16 is shown as having the output of channel $c_4$ (the "D" channel) connected thereto, with the output of OR gate 16 being used as an enable bit connected to SW 18 to permit transmission therethrough of word $W_0$, shown as going to a bus. A fourth byte (of course having at least one "1" bit therein) arriving over the "D" channel will create an output from OR gate 16 in the same manner as described earlier with respect to OR gates 2 and 5, and will similarly "announce" to SW 18 that (in this case) a word $W_i$ has been completely formed, hence SW 18 will thus pass word $W_i$ on to the bus.

Figure 8:
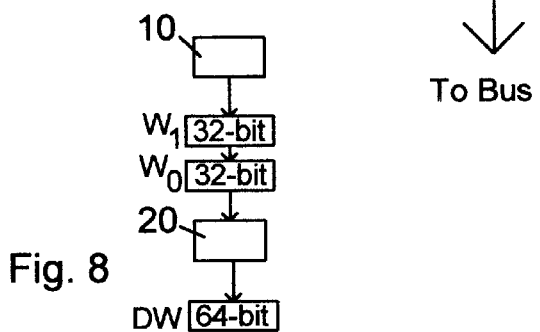
FIG. 8 shows the use of a concatenator of twice the capacity of those of FIGS. 6, 7 to produce a 64-bit "double word."

As now shown in FIG. 8, a concatenator 20 having the same basic circuitry as does concatenator 10 but with the capacity to receive 32-bit words can be used to concatenate two or more of such words into 64-bit "double words" (DW), and of course larger words may be formed by the use of any desired combination of concatenators 10 or 20 or the like. The sequential words $W_0$ and $W_1$ are directed into an input node of concatenator 20 as was the case with concatenator 10, and the double word DW is then produced at the output of concatenator 20. It will be evident that the same system may be applied to the concatenation of bytes or words of arbitrary size, the only restriction in the circuitry as shown being that any word deriving from a concatenator having an input capacity of n bits per byte or word must have a size that is some integral multiple m of the original n-bit capacity, i.e., the word size w=n×m, such as 3×3=9. Of course, if m>4, then counter 6 of FIG. 4 which appends a position byte PB' into the corresponding "y" positions of the resultant position labeled bytes or words must have a higher upper count of j than 4, and hence the "y" position and interconnecting line must have a capacity greater than 2 bits.

It is also evident that within the maximum width of the data channels of a particular computer system, both the initial byte size (from one bit on up) and the highest value of j can be pre-selected as required in the fabrication of a particular embodiment of this aspect of the invention for a particular application. One such application might be in the transmission to a computer of numerical data to be processed. If the inherent nature of the data to be collected had a precision such that the value thereof would in any event be fully expressible, say, in no more than an 8-bit byte, it would be wasteful of both transmission time and CPU usage to operate on 18-bit data, if such were the form of the incoming data (as established earlier, say, by a laboratory instrument). One might then strip such incoming data of their eight least significant bits and transmit only the eight most significant bits, i.e., the total amount of data to be processed would have been halved without the use of any computer time.

Insertion into such a "stripped" data input line (i.e., comprising a sequence of 8-bit bytes interspersed by periods of "silence" of corresponding length) of an embodiment of concatenator 10 that was functioning as just described would thus further multiply the efficiency of the computer operation by the ratio of p/n, where p is the bit size of the bus line and n is the byte size, i.e., concatenating 8-bit bytes into 32-bit words multiplies the throughput efficiency by a factor of four. Inasmuch as the invention operates asynchronously and depends for its operation upon the arrival thereto of non-zero bytes, the fact that such incoming data had been "stripped" as just described would have no effect on the normal operation of concatenator 10, except insofar as one might notice it to be operating in evenly timed "bursts."

When any such concatenation process is used, either the programming that subsequently operates upon the data so provided must parse those 32-bit words back into 8-bit bytes or the different A, B, C, D channels must route to different, distinguishable addresses and hence appear in their original form as four 8-bit bytes, the function of the concatenation not being to create a 32-=bit word for its own sake but rather simply to utilize the data channel more efficiently.

Other arrangements and dispositions of the aforesaid or like components, the descriptions of which are intended to be illustrative only and not limiting, may also be made without departing from the spirit and scope of the invention, which must be identified and determined only from the following claims and equivalents thereof.

I claim:

1. A method of data enumeration comprising:
   (a) sequentially providing a series of equal-sized digital data segments to a buffer memory location;
   (b) simultaneously providing said sequence of equal-sized data segments to a trigger device connected in parallel with said buffer memory location, wherein said trigger device generates a trigger signal upon the arrival thereto of each said data segment;
   (c) providing a counting means interconnected between said trigger device and said memory buffer location, wherein said counting means provide a segment count that increments by "1" upon receiving each successive trigger signal; and
   (d) extracting from said counting means said segment count respectively associated with each of said data segments.

2. A data enumerator comprising:
   (a) an OR gate adapted to receive a series of data segments;
   (b) a data buffer connected in parallel to said OR gate;
   (c) a positional data buffer; and
   (d) a counter circuit interconnected between said OR gate and said positional data buffer and adapted to carry out a count of the receptions of individual data segments within said sequence of data segments and in each case to append a resultant count value to that one of said data segments that gave rise to each said count value.

3. The data enumerator of claim 2 wherein said counter circuit is further adapted to define a limiting count value, to terminate a particular count when said limiting count value has been reached, and upon the arrival thereafter of another data segment to commence a new count.

4. The data enumerator of claim 3 wherein said counting means is a flip-flop.

5. The data enumerator of claim 3 wherein said counting means is a flip-flop.

6. A data enumerator comprising:
   (a) trigger means to mark instances of the asynchronous arrival of individual sequences of digital code;
   (b) a data buffer connected in parallel to said trigger means;
   (c) a positional data buffer; and
   (d) counting means interconnected between said trigger means and said positional data buffer to count instances of the arrival of individual sequences of digital code.

7. The data enumerator of claim 6 wherein said trigger means is an OR gate.

8. The data enumerator of claim 6 wherein said counting means is a flip-flop.

9. The data enumerator of claim 6 wherein said counting means is a cyclical counter.

10. The data enumerator of claim 6 wherein said counting means is further adapted to define a limiting count value, to terminate a particular count when said limiting count value has been reached, and upon the arrival thereafter of another data segment to commence a new count.

* * * * *

UNITED STATES PATENT AND TRADEMARK OFFICE
CERTIFICATE OF CORRECTION

PATENT NO. : 6,580,378 B1
DATED : June 17, 2003
INVENTOR(S) : William S. Lovell

It is certified that error appears in the above-identified patent and that said Letters Patent is hereby corrected as shown below:

<u>Column 8,</u>
Line 25, delete "flip-flop" and replace with -- cyclical counter --.

Signed and Sealed this

Twentieth Day of April, 2004

JON W. DUDAS
*Acting Director of the United States Patent and Trademark Office*